:::

United States Patent
Suthar et al.

(10) Patent No.: US 8,091,057 B1
(45) Date of Patent: Jan. 3, 2012

(54) SYNTHESIS, PLACE, AND ROUTE RESPONSIVE TO REASONS FOR CRITICAL PATHS NOT MEETING PERFORMANCE OBJECTIVE

(75) Inventors: Vishal Suthar, San Jose, CA (US); Vinod K. Nakkala, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 272 days.

(21) Appl. No.: 12/604,764

(22) Filed: Oct. 23, 2009

(51) Int. Cl.
*G06F 17/50* (2006.01)
(52) U.S. Cl. ........... 716/113; 716/100; 716/108; 703/14
(58) Field of Classification Search .................. 716/100, 716/108, 113; 703/14
See application file for complete search history.

(56) References Cited

U.S. PATENT DOCUMENTS

| | | | |
|---|---|---|---|
| 6,622,291 B1 * | 9/2003 | Ginetti | 716/108 |
| 6,993,731 B2 * | 1/2006 | Whitaker et al. | 716/103 |
| 7,337,100 B1 * | 2/2008 | Hutton et al. | 703/13 |
| 7,516,434 B2 * | 4/2009 | Okabe | 716/119 |
| 7,546,567 B2 * | 6/2009 | Cheon et al. | 716/113 |
| 2009/0031278 A1 * | 1/2009 | McElvain et al. | 716/18 |
| 2010/0180240 A1 * | 7/2010 | Davis et al. | 716/5 |

\* cited by examiner

*Primary Examiner* — Naum Levin
(74) *Attorney, Agent, or Firm* — LeRoy D. Maunu; Lois D. Cartier (57) ABSTRACT

Methods are provided for implementing a design of an integrated circuit meeting a performance objective. A timing analysis for the design specifies critical timing paths that do not meet the performance objective. Reasons are determined for the critical timing paths failing to meet the performance objective. A specification of the design is synthesized into a netlist specifying interconnections of primitive elements. The synthesis includes controlling a fanout of a primitive element on each critical timing path failing from excessive fanout. The primitive elements are placed at respective positions, including priority placement of a primitive element on each critical timing path failing from bad placement. The interconnections are routed between the primitive elements at the respective positions. The routing includes priority routing of an interconnection on each critical timing path failing from long routing. A specification of the placed and routed primitive elements is stored.

20 Claims, 5 Drawing Sheets

FIG. 1

| Critical path | Timing analysis, target delay 750 ps | | | | Weightings for determining whether the failure reason is fanout, placement, routing, or skew | | | |
|---|---|---|---|---|---|---|---|---|
| | Fanout of source | Critical path delay | | Skew of path | Fanout | Placement | Routing | Skew |
| | | Achievable | Observed | | | | | |
| A | 100 | 700 | 850 | 30 | 200 | 0 | 120 | 30 |
| B | 2 | 1200 | 1250 | 10 | 4 | 450 | 40 | 10 |
| C | 3 | 450 | 800 | 10 | 6 | 0 | 340 | 10 |
| D | 2 | 700 | 790 | 90 | 4 | 0 | 0 | 90 |

SYNTHESIS, PLACE, AND ROUTE RESPONSIVE TO REASONS FOR CRITICAL PATHS NOT MEETING PERFORMANCE OBJECTIVE

FIELD OF THE INVENTION

The present invention generally relates to the design of integrated circuits, and more particularly to synthesis, placement, and routing of integrated circuits.

BACKGROUND

Designer productivity improves from designing an integrated circuit at a high level of abstraction and translating the abstract design into a layout of the integrated circuit. The abstract design is translated into a layout using synthesis, placement, and routing. However, synthesis, placement, and routing are iterative processes, because the first layout generally does not meet the performance requirements for the integrated circuit. Synthesis, placement, and routing are also time consuming and difficult. The tools for synthesis, placement, and routing require extensive designer expertise, and even expert designers cannot reliably predict the effects of a change made to meet performance requirements. Thus, synthesis, placement, and routing are time consuming processes of trial and error. The improved designer productivity from abstract design is lost when synthesis, placement, and routing require too many iterations.

The present invention may address one or more of the above issues.

SUMMARY

Various embodiments of the invention provide methods for implementing a design of an integrated circuit that meets a performance objective. A specification of the design is input in a hardware description language. A timing analysis is generated for the design. The timing analysis specifies critical timing paths that do not meet the performance objective. Respective reasons are determined for the critical timing paths not meeting the performance objective. The respective reason for each critical timing path can be excessive fanout, bad placement, long routing, or another reason. The specification of the design is synthesized into a netlist specifying interconnections of primitive elements. The synthesis includes controlling a fanout of a primitive element on each critical timing path that does not meet the performance objective for the respective reason of excessive fanout. The primitive elements are placed at respective positions. The placement includes priority placement of a primitive element on each critical timing path that does not meet the performance objective for the respective reason of bad placement. The interconnections are routed between the primitive elements at the respective positions. The routing includes priority routing of an interconnection on each critical timing path that does not meet the performance objective for the respective reason of long routing. A specification of the placed and routed primitive elements is stored.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
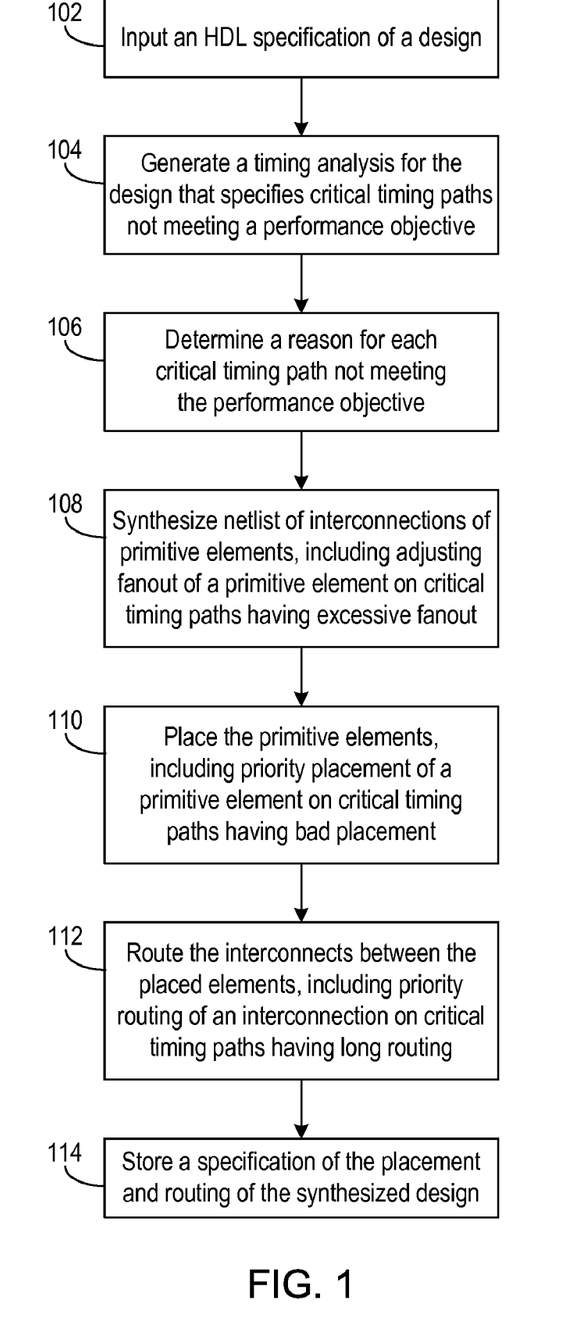
FIG. 1 is a flow diagram of a process for implementing a design of an integrated circuit to meet a performance objective in accordance with various embodiments of the invention.

FIG. 1 is a flow diagram of a process for implementing a design of an integrated circuit to meet a performance objective in accordance with various embodiments of the invention. The process determines a reason for each critical timing path not meeting the performance objective, and the process implements the design while specifically addressing the reasons for the failure of the critical timing paths.

At step 102, a specification of the design in a hardware description language (HDL) is input. At step 104, a timing analysis is generated for the design, and the timing analysis specifies the timing paths of the design that do not meet a performance objective. An example performance objective is that every timing path of the design has a propagation delay less than the period of a clock signal for the design.

At step 106, a reason is determined for each critical timing path not meeting the performance objective. In one embodiment, the reason is excessive fanout, bad placement, or long routing. In another embodiment, the reason is excessive fanout, bad placement, long routing, or excessive clock skew.

At step 108, a netlist is synthesized from the HDL specification of the design. The netlist specifies primitive elements and their interconnections for implementing the design. For each critical timing path not meeting the performance objective because of excessive fanout, one or more primitive elements on this critical timing path are duplicated to mitigate the excessive fanout. In one embodiment, the source of the critical timing path is the primitive element that is duplicated. In another embodiment, another primitive element on the critical timing path is duplicated.

At step 110, the primitive elements are placed. For each critical timing path not meeting the performance objective because of bad placement, one or more primitive elements on this critical timing path are priority placed. In one embodiment, each primitive element on the critical timing paths is placed before any of the primitive elements not on a critical timing path are placed. In another embodiment, primitive elements are priority placed when they are on critical timing paths not meeting the performance objective for the reason of excessive clock skew. This priority placement includes placing the source and the destination of these critical timing paths to improve the clock skew between the source and the destination.

At step 112, the interconnections are routed between the placed elements. For each critical timing path not meeting the performance objective because of long routing, one or more interconnections on this critical timing path are priority routed. In one embodiment, the interconnections are initially routed while ignoring any overlap between the interconnections, and overlapping interconnections are subsequently rerouted while limiting the rerouting of interconnections on these critical timing paths.

At step 114, a specification of the placed and routed netlist is stored in a processor-readable storage device, such as provided by electronic, optical, or magnetic media. Because the synthesis, placement, and routing address the specific reasons causing the critical timing paths, the implemented design is more likely to meet the performance objective. In one embodiment, the implemented design is analyzed to check for remaining critical timing paths and the process is repeated until the performance objective is met.

Figure 2:
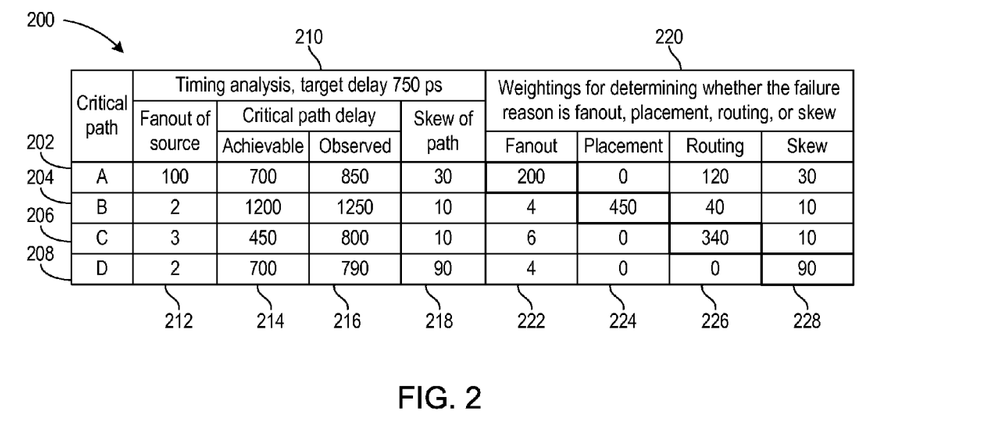
FIG. 2 is a table illustrating determining reasons for example critical timing paths not meeting the performance objective in accordance with various embodiments of the invention.

FIG. 2 is a table 200 illustrating determining reasons for example critical timing paths not meeting the performance objective in accordance with various embodiments of the invention. Each critical timing path is evaluated to weigh the possible causes for the critical timing path not meeting the performance objective, and the failure reason is the cause with the higher weight.

A timing analysis of an example design specifies the example critical timing paths having rows 202, 204, 206, and 208 in table 200. In one embodiment, the example design is synthesized, placed, and routed and the timing analysis is generated from the resulting implementation.

The timing analysis also provides characteristics shown in column 210. These characteristics include a fanout in column 212, an achievable delay in column 214, an observed delay in column 216, and a clock skew in column 218.

In one embodiment, the fanout in column 212 is a number of the primitive elements that are a destination of the primitive element that is a source of the critical timing path. Generally, the fanout in column 212 is a measure of the loading on each critical timing path.

In one embodiment, the achievable delay in column 214 is an analytical bound on the delay achievable given a placement of the primitive elements on the critical timing paths. In another embodiment, the achievable delay in column 214 is the propagation delay between the source and destination of the critical timing path after placement of the primitive elements and a routing of the interconnections that permits overlap between the interconnections. Generally, the achievable delay in column 214 is a performance measure that ignores routing constraints.

In one embodiment, the observed delay in column 216 is the actual propagation delay between the source and destination of the critical timing path in an implementation of the design. This observed or implemented delay in column 216 is the delay that needs improvement to meet the performance objective.

In one embodiment, the clock skew in column 218 is the clock skew between the source and destination of the critical timing path. In another embodiment, clock skew is ignored because clock skew is not a possible cause for the critical timing paths not meeting the performance objective.

Column 220 shows the weightings of the possible causes for the critical timing paths not meeting the performance objective. These weightings include a fanout weighting in column 222, a placement weighting in column 224, a routing weighting in column 226, and a clock skew weighting in column 228.

In the illustrated embodiment, the fanout weighting in column 222 is a scaling of the fanout in column 212, for example, two picoseconds for each fanout in column 212. Thus, for each of the rows 202, 204, 206, and 208, the fanout weighting in column 222 is two picoseconds times the corresponding fanout in column 212. In another embodiment, the fanout weighting for column 222 is a propagation delay through a hypothetical buffer chain or tree driving the fanout loading of column 212. The fanout weighting in column 222 generally gives a measure of the amount of propagation delay caused by the fanout of each critical timing path.

In the illustrated embodiment, the placement weighting in column 224 is a difference between the achievable delay in column 214 and a target delay from the performance objective for the design. In this example, the target delay is a clock period for the design of 750 picoseconds, and for each of the rows 202, 204, 206, and 208, the placement weighting in column 224 is the difference between the achievable delay in column 214 and this target delay. The placement weighting in column 224 is optionally constrained to be non-negative, as shown. The positive placement weighting for row 204 and column 224 indicates that the critical timing path for row 204 cannot meet the performance objective even for an implementation that obtains the achievable delay in column 214. The placement weighting in column 224 generally gives a measure of the amount of propagation delay attributed to bad placement of each critical timing path.

In the illustrated embodiment, the routing weighting in column 226 is a difference between the observed delay in column 216 and a sum of the achievable delay and the clock skew in columns 214 and 218. In another embodiment ignoring clock skew, the routing weighting is a difference between the observed and achievable delays. The positive placement weighting in column 226 indicate varying degrees of propagation delays caused by the routing of the critical signals. The routing weighting in column 226 generally gives a measure of the amount of propagation delay attributed to the routing of each critical timing path.

In the illustrated embodiment, the clock skew weighting in column 228 is the clock skew from column 218. In another embodiment, the clock skew is ignored. The clock skew weighting in column 228 gives a measure of the amount of propagation delay caused by excessive clock skew between the source and destination of each critical timing path.

The weightings in column 220 for each of the rows 202, 204, 206, and 208 are compared and larger weighting is selected for each critical timing path. Thus, the critical timing path of row 202 fails to meet the performance objective for the reason of excessive fanout because the larger of the weightings in column 220 is the fanout weighting in column 222. Similarly, the critical timing path of row 204 fails for the reason of bad placement, the critical timing path of row 206 fails for the reason of long routing, and the critical timing path of row 208 fails for the reason of excessive clock skew.

The reason for each critical timing path corresponds to the principal cause of the critical timing path not meeting the performance objective. Thus, the reason indicates the aspect of the critical timing path that primarily needs improvement. Various embodiments of the invention implement a design that meets a performance objective by addressing the principal reason causing the failure of each critical timing path. Other approaches attempt to improve multiple causes of failure for each critical timing path. However, because improving one critical timing path is likely to worsen other critical timing paths and create new critical timing paths, the secondary reasons of failure for a critical timing path are less likely to improve the critical timing path and are likely to worsen or create other critical timing paths. Thus, other approaches that attempt to improve multiple causes of failure for each critical timing path are less likely to implement a design meeting the performance objective.

In one embodiment of the invention, synthesis, placement, and routing are done iteratively with one failure reason selected for each critical timing path in each iteration. The selected reason modifies the synthesis, placement, and routing of the next iteration. If the modification fixes a critical timing path, then the secondary reasons were unnecessary to make the critical timing path meet the performance objective. If the modification improves a critical timing path, but the critical timing path still does not meet the performance objective, then another reason is selected for the critical timing path, and multiple reasons modify the synthesis, placement, and routing of a subsequent iteration. Thus, secondary reasons are selected for a critical timing path when necessary to meet the performance objective. The iterations stop after meeting the performance objective, or after reaching an iteration limit.

Figure 3:
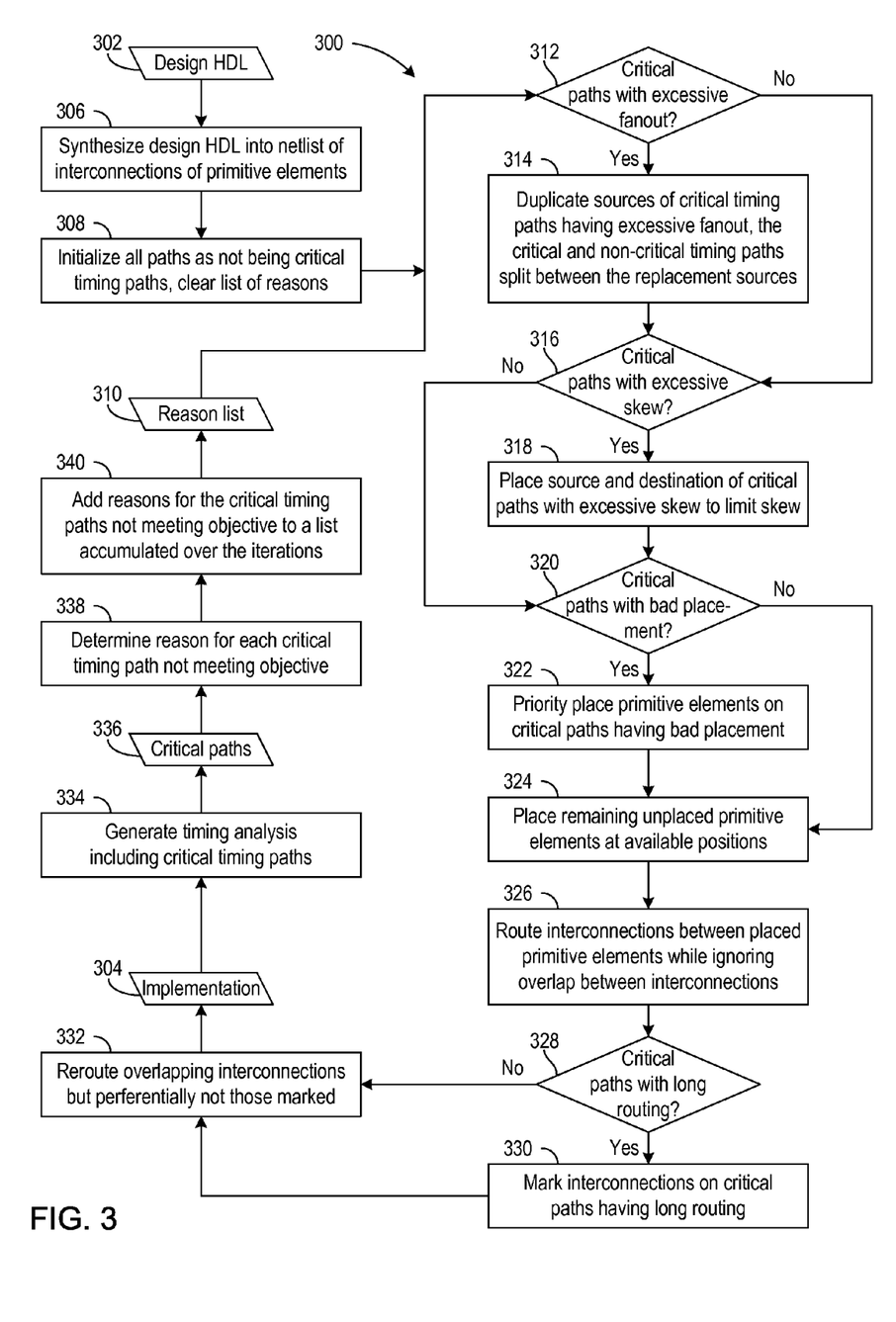
FIG. 3 is a flow diagram of an iterative process for implementing a design of an integrated circuit to meet a performance objective in accordance with various embodiments of the invention.

FIG. 3 is a flow diagram of an iterative process 300 for implementing a design of an integrated circuit to meet a performance objective in accordance with various embodiments of the invention. Process 300 transforms the specification 302 of the design in a hardware description language into an implementation 304 of the design that meets a performance objective.

At step 306, the HDL specification 302 is synthesized into a netlist of primitive elements and interconnections between the primitive elements. In one embodiment, the timing paths of the synthesized design are paths from a source to a destination through the primitive elements and interconnections. Each source is the output of a clocked register or an input of the design, and each destination is the input of a clocked register or an output of the design. At step 308, the timing paths of the synthesized design are initialized to not be critical timing paths. The reasons list 310 is also cleared at step 308.

During the first iteration of process 300, decision 312 skips step 314 because there are not yet any critical timing paths. Similarly, decision 316 skips step 318 and decision 320 skips step 322 during the first iteration of process 300. At step 324, all primitive elements become placed at available locations in an integrated circuit. At step 326, the interconnections are routed between the placed primitive elements while ignoring any overlap between the routed connections. During the first iteration of process 300, decision 328 skips step 330. At step 332, overlapping interconnections are rerouted to eliminate the overlap, producing implementation 304 of the HDL specification 302 of the design.

At step 334, a timing analysis is generated from the implementation 304 of the design. The timing analysis specifies critical timing paths 336 that do not meet a performance objective, such as a limit on the propagation delay of the timing paths of the implementation 304.

At step 338, a failure reason is determined for each of the critical timing paths 336. In one embodiment, the reason is excessive fanout, bad placement, long routing, or excessive clock skew, as previously discussed in connection with FIG. 2. In another embodiment, clock skew is ignored. At step 340, the reasons determined at step 338 are added to the reasons list 310. The reasons list 310 accumulates the reasons determined during each iteration of step 338.

In the subsequent iterations, decision 312 checks whether any of the critical timing paths 336 appear in the reason list 310 as having excessive fanout. Decision 312 proceeds to step 314 if critical timing paths have excessive fanout. At step 314, the source of each critical timing path with excessive fanout is duplicated, and the primitive elements driven by the source are split with one replacement source driving the primitive elements on the critical timing paths, and the other replacement source driving the remaining primitive elements. Alternatively, one or more primitive elements are duplicated on each critical timing path having excessive fanout. For each such duplicated primitive element, the subset of critical timing paths passing through the duplicated primitive element are assigned to pass through one replacement element and other timing paths are assigned to pass through the other replacement element.

Decision 316 checks whether any of the critical timing paths 336 appear in the reason list 310 as having excessive clock skew. Decision 316 proceeds to step 318 if critical timing paths have excessive clock skew. At step 318, the source and the destination of the critical timing path are placed to control clock skew. In one embodiment, the placement locations have associated clock skews and the source and destination of the critical timing path are placed to increase the relative clock skew between the source and the destination.

Decision 320 checks whether any of the critical timing paths 336 appear in the reason list 310 as having bad placement. Decision 320 proceeds to step 322 if any critical timing paths have bad placement. At step 322, priority placement is provided for one or more primitive elements on the critical timing paths having bad placement. In one embodiment, the placement places the primitive elements on the critical timing paths with bad placement before placing the remaining primitive elements at step 324 and routing interconnections at step 326.

Decision 328 checks whether any of the critical timing paths 336 appear in the reason list 310 as having long routing. Decision 328 proceeds to step 330 if critical timing paths have long routing. At step 330, the interconnections having long routing are marked for preferential treatment during rerouting at step 332. At step 332, overlap between interconnections is removed by rerouting the overlapping interconnections. When overlapping interconnections include marked and unmarked interconnections, the unmarked interconnections are rerouted before rerouting any of the marked interconnections.

The implementation 304 from placement and routing of each iteration is analyzed at step 334 to determine the critical timing paths 336. If there are no critical timing paths 336, then the performance objective for the design is met by the current implementation 304 and process 300 terminates. Process 300 also terminates when an iteration limit is reached. In one embodiment, process 300 also terminates when the current implementation 304 is not a significant improvement over the implementation from the prior iteration.

In the illustrated embodiment, the HDL specification 302 is synthesized into a netlist once, and this netlist is iteratively placed and routed after modification at step 314 to limit fanout. However, the modification of step 314 is considered part of synthesis. In another embodiment, each iteration repeats the synthesis of the HDL specification.

Figure 4:
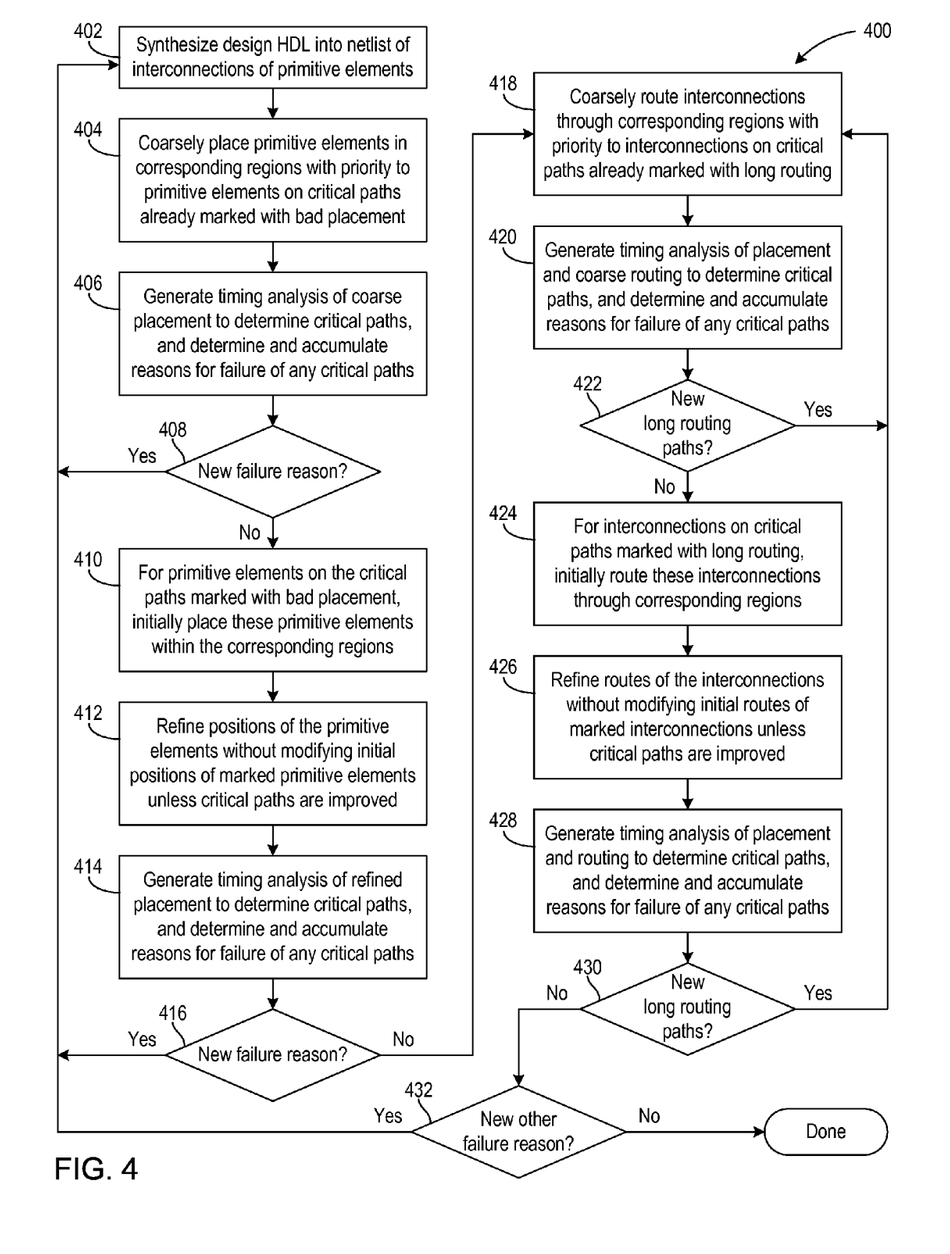
FIG. 4 is a flow diagram of a process for iterative placement and iterative routing for implementing a design of an integrated circuit to meet a performance objective in accordance with one embodiment of the invention.

FIG. 4 is a flow diagram of a process 400 for iterative placement and iterative routing for implementing a design of an integrated circuit to meet a performance objective in accordance with one embodiment of the invention. Iteration within placement and within routing improves the performance of the implementation produced by the placement and routing.

At step 402, the HDL specification of the design is synthesized into a netlist of interconnections between primitive elements. At step 404, the primitive elements are coarsely placed in regions of the integrated circuit. At step 406, a timing analysis of the coarse placement determines the critical timing paths for the coarse placement, and a reason is determined for the failure of each critical timing path.

In one embodiment, the timing analysis does not produce the observed delay of an implementation because routing is not yet available, but the timing analysis does produce a fanout and an achievable delay. This early timing analysis also produces a clock skew when the regions have specified clock skews. For this early timing analysis, the critical timing paths are the timing paths with an achievable delay that does not meet the performance objective. For each critical timing path, a fanout weighting is a scaling of the fanout and a placement weighting is an amount that the achievable delay exceeds a target delay. If the regions have specified clock skews, a clock skew weighting is the clock skew between the source and destination of each critical timing path. The available weightings are compared, and the comparison provides a failure reason of excessive fanout, bad placement, and optionally excessive clock skew for each critical timing path.

Decision 408 checks whether the current iteration of step 406 produced a new reason of failure for any critical timing path. The failure reasons are accumulated, and a failure reason is new when the failure reason has not been previously encountered for a particular timing path.

When one or more critical timing paths have a new failure reason, process 400 returns to step 402 from decision 408. In one embodiment, the synthesis modifies the netlist of the prior iteration to duplicate primitive elements on any critical timing paths newly failing for excessive fanout. The iteration then continues to step 404, and the primitive elements are again placed in regions with priority placement of the primitive elements on the critical timing paths failing from bad placement. In an embodiment with clock skews assigned to the regions, the priority placement includes priority placement of the source and destination of the critical timing paths failing from excessive clock skew.

After decision 408 finds no more new failure reasons for an iteration of the coarse placement, process 400 proceeds to step 410 to refine the coarse placement. Because new failures should eventually cease, process 400 terminates even when process 400 cannot achieve the performance objective. Such a substandard final implementation provides designer feedback. However, the last iteration of steps 402, 404, and 406 frequently produces a coarse placement that meets the performance objective and consequently includes no critical timing paths. The accumulated failure reasons are kept to influence the refined placement and for possible return to synthesis and coarse placement.

At step 410, the primitive elements on critical timing paths failing for bad placement are placed at specific positions within the already assigned regions. The source and designation of critical timing paths failing for excessive clock skew are also placed at specific positions within the already assigned regions. At step 412, the remaining primitive elements are placed at specific positions within the already assigned regions. Then the placement is optionally adjusted, including potentially moving a primitive element to another region, so long as each adjustment improves the critical timing paths failing for bad placement or excessive skew. At step 414, a timing analysis is generated for the refined placement, and failure reasons are determined and further accumulated for any critical timing paths in the timing analysis. The possible reasons for a critical timing path not meeting the performance objective are excessive fanout, bad placement, and excessive clock skew.

Decision 416 checks whether the new refined placement produced new failure reasons. If the refined placement produced new failure reasons, process 400 returns to step 402; otherwise, process 400 proceeds to step 418 to route the refined placement. Because routing can cause a return to synthesis and placement, all accumulated reasons of failure are kept to again influence any such return to synthesis and placement.

At step 418, interconnections are coarsely routed through regions of the integrated circuit. At step 420, a timing analysis determines the critical timing paths of the coarse routing of the placement of design. Because the coarse routing provides a rough implemented delay for the critical timing paths, the reason for failure of each critical timing paths is excessive fanout, bad placement, excessive clock skew, or long routing.

Decision 422 checks whether step 420 identified a new failure reason that is long routing for any critical timing path. If a new long routing failure is encountered, process 400 returns to step 418 and each interconnection on the critical timing path with long routing receives priority routing through the regions of the integrated circuit. Reasons of failure found at step 420 can include excessive fanout, bad placement, and excessive clock skew; however, these reasons are accumulated and not immediately addressed. This permits completion of an iteration of coarse and fine routing to find many of the timing paths failing from long routing before returning to synthesis and placement.

After no more critical timing paths with long routing are discovered at step 420, process 400 proceeds from decision 422 to step 424 to refine the coarse routing. At step 424, interconnections on critical timing paths marked with long routing are routed through specific wiring in the assigned regions of the integrated circuit. At step 426, the remaining interconnections are routed through specific wiring in the assigned regions of the integrated circuit, and the interconnections are optionally adjusted, potentially routing certain interconnections through an unassigned region, so long as each adjustment improves the critical timing paths marked with long routing. At step 428, a timing analysis determines the critical timing paths of the refined routing of the placement, and reasons of failure are determined for the critical timing paths.

Decision 430 checks whether step 428 identified a new failure reason that is long routing for any critical timing path. For a critical timing path newly failing for long routing, process 400 returns to step 418 to again route the current placement of the integrated circuit. After no more critical timing paths with long routing are discovered at step 428, process 400 proceeds from decision 430 to decision 432. Decision 432 checks whether the coarse and refined routing found any new failures of excessive fanout, bad placement, or excessive clock skew. For such new failures, process 400 returns to step 402 to address these new failures with another iteration of synthesis, coarse and refined placement, and coarse and refined routing. Process 400 completes when no new failures of excessive fanout, bad placement, or excessive clock skew are produced during the coarse and refined routing of a particular placement.

While process 400 has more possible points of iteration than a simpler process that completes synthesis, placement, and routing before checking for critical timing paths that do not meet the performance objective, process 400 actually has improved efficiency, because many critical timing paths and their reasons for failure are determined before completing an implementation of the design.

Figure 5:
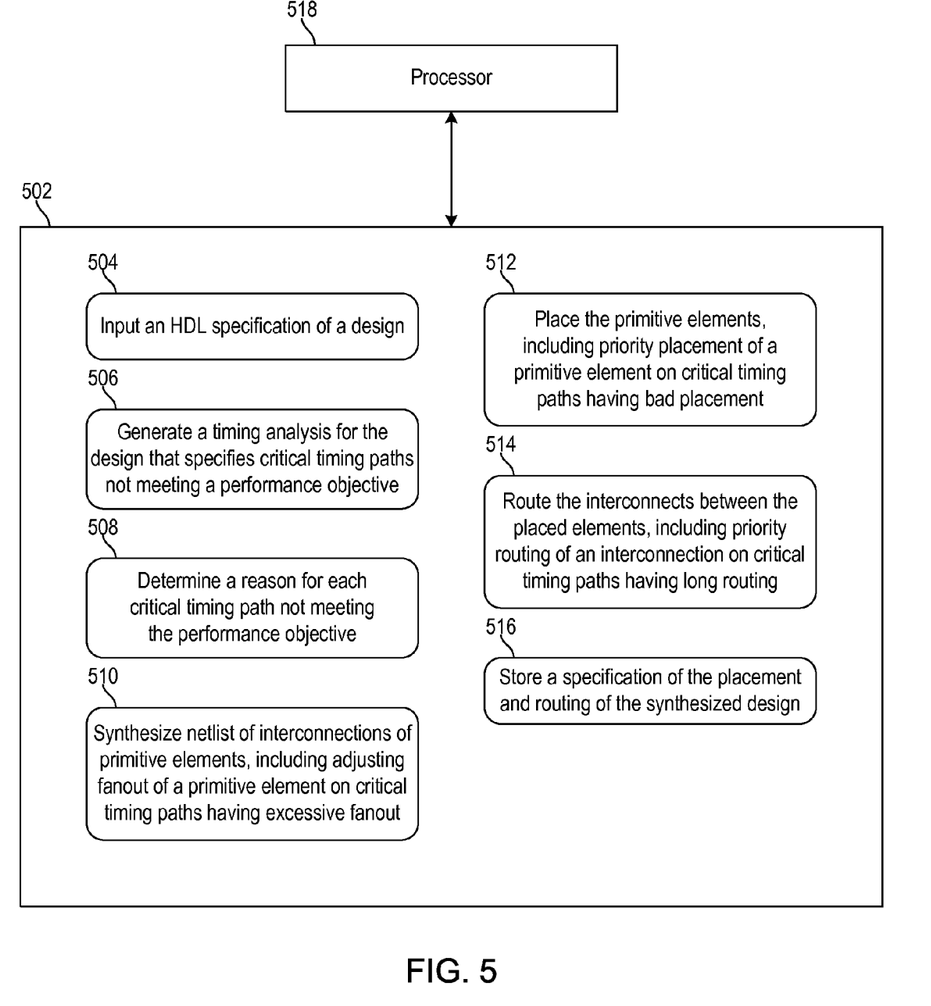
FIG. 5 is a block diagram of a system for implementing a design of an integrated circuit to meet a performance objective in accordance with one embodiment of the invention.

FIG. 5 is a block diagram of a system for implementing a design of an integrated circuit to meet a performance objective in accordance with one embodiment of the invention. Processor-readable storage device 502 is configured with software modules 504, 506, 508, 510, 512, 514, and 516 for implementing a design of an integrated circuit to meet a performance objective.

Execution of the instructions in software module 504 causes processor 518 to input a specification of the design in a hardware description language. Execution of the instructions in software module 506 causes processor 518 to generate a timing analysis for the design. The timing analysis specifies the critical timing paths that do not meet the performance objective. Execution of the instructions in software module 508 causes processor 518 to determine respective reasons for the critical timing paths not meet the performance objective. The respective reason for each critical timing path is excessive fanout, bad placement, or long routing.

Execution of the instructions in software module 510 causes processor 518 to synthesize the specification of the design into a netlist specifying interconnections of primitive elements. The synthesis includes controlling a fanout of a primitive element on each of the critical timing paths when the critical timing path does not meet the performance objective for the respective reason of excessive fanout. Execution of the instructions in software module 512 causes processor 518 to place the primitive elements at respective positions. The placement includes priority placement of a primitive element on each of the critical timing paths when that critical timing path does not meet the performance objective for the respective reason of bad placement.

Execution of the instructions in software module 514 causes processor 518 to route the interconnections between the primitive elements at their respective positions. The routing includes priority routing of an interconnection on each of the critical timing paths when that critical timing path does not meet the performance objective for the respective reason of long routing. Execution of the instructions in software module 516 causes processor 518 to store a specification of the placement and the routing of the synthesized specification of the design in memory arrangement 502 or in some other memory.

Those skilled in the art will appreciate that various alternative computing arrangements, including one or more processors and a memory arrangement configured with program code, would be suitable for hosting the processes, modules, and data structures and implementing the different embodiments of the present invention. In addition, program code that implements the processes may be provided via a variety of computer-readable storage media or delivery channels such as magnetic or optical disks or tapes, electronic storage devices, or as application services over a network.

The architecture of the computing arrangement depends on implementation requirements, as would be recognized by those skilled in the art. For example, processor 518 may be one or more general purpose processors, or a combination of one or more general purpose processors and suitable co-processors, or one or more specialized processors (e.g., RISC, pipelined, etc.).

The processor-readable device 502 may be a memory/storage arrangement that provides hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for implementing a design of an integrated circuit to meet a performance objective, comprising:
   using one or more processors to perform operations including:
   inputting a specification of the design in a hardware description language;
   generating a timing analysis for the design, the timing analysis specifying a plurality of critical timing paths that do not meet the performance objective;
   determining a plurality of respective reasons for the critical timing paths not meeting the performance objective, wherein the respective reason for each critical timing path is one of excessive fanout, bad placement, and long routing;
   synthesizing the specification of the design into a netlist specifying a plurality of interconnections of a plurality of primitive elements, wherein the synthesizing includes controlling a fanout of one of the primitive elements on each of the critical timing paths in response to the respective reason of the critical timing path not meeting the performance objective being excessive fanout;
   placing the primitive elements at a plurality of respective positions, wherein the placing includes priority placing of one of the primitive elements on each of the critical timing paths in response to the respective reason for the critical timing path not meeting the performance objective being bad placement;
   routing the interconnections between the primitive elements at the respective positions, wherein the routing includes priority routing of one of the interconnections on each of the critical timing paths in response to the respective reason for the critical timing path not meeting the performance objective being long routing; and
   storing a specification of the primitive elements placed by the placing step and the interconnections routed by the routing step.

2. The processor-implemented method of claim 1, wherein the generating of the timing analysis for the design includes:
   synthesizing the specification of the design into a netlist specifying a plurality of interconnections of a plurality of primitive elements;
   placing the primitive elements at a plurality of initial respective positions;
   routing the interconnections between the primitive elements at the initial respective positions; and
   generating the timing analysis from the primitive elements placed at the initial respective positions and the interconnections routed between the primitive elements at the initial respective positions.

3. The processor-implemented method of claim 1, wherein the determining of the respective reason for each of the critical timing paths includes determining
   a first weighting of a fanout from the primitive element that is a source of the critical timing path to the primitive elements that are destinations of the source,
   a second weighting of a difference between a target delay of the performance objective and an achievable delay from the source to the destination of the critical timing path, and a third weighting of a difference between the achievable delay and an implemented delay from the source to the destination through the primitive elements and the interconnections of the critical timing path.

4. The processor-implemented method of claim 3, wherein the respective reason for the critical timing path is the excessive fanout in response to the first weighting exceeding the second and third weightings, the bad placement in response to the second weighting exceeding the first and third weightings, and the long routing in response to the third weighting exceeding the first and second weightings.

5. The processor-implemented method of claim 1, wherein the plurality of respective reasons include excessive clock skew.

6. The processor-implemented method of claim 5, wherein the placing of the primitive elements at the respective positions includes placing of one of the primitive elements on each of the critical timing paths at the respective position for controlling clock skew in response to the respective reason for the critical timing path not meeting the performance objective being excessive clock skew.

7. The processor-implemented method of claim 5, wherein the determining of the respective reason for each of the critical timing paths includes determining
 a first weighting of a fanout from the primitive element that is a source of the critical timing path to the primitive elements that are destinations of the source,
 a second weighting of a difference between an achievable delay and a target delay of the performance objective,
 a third weighting of a difference between an implemented delay and a sum of the achievable delay and a clock skew, and
 a fourth weighting of the clock skew, for the achievable delay from the source to the destination of the critical timing path, the implemented delay from the source to the destination through the primitive elements and the interconnections of the critical timing path, and the clock skew between the source and the destination of the critical timing path.

8. The processor-implemented method of claim 7, wherein:
 the respective reason for the critical timing path is excessive fanout in response to the first weighting exceeding the second, third, and fourth weightings;
 the respective reason for the critical timing path is bad placement in response to the second weighting exceeding the first, third, and fourth weightings;
 the respective reason for the critical timing path is long routing in response to the third weighting exceeding the first, second, and fourth weightings; and
 the respective reason for the critical timing path is excessive clock skew in response to the fourth weighting exceeding the first, second, and third weightings.

9. The processor-implemented method of claim 1, wherein the controlling of the fanout includes duplicating the primitive element that is a source of the critical timing path in response to the critical timing path not meeting the performance objective for the respective reason of excessive fanout from the source.

10. The processor-implemented method of claim 1, wherein the controlling of the fanout of the primitive element on the critical timing path includes duplicating the primitive element in response to the critical timing path not meeting the performance objective for the respective reason of excessive fanout.

11. The processor-implemented method of claim 10, wherein the duplicating of the primitive element includes, for a subset of the critical timing paths that pass through the primitive element and for a plurality of additional paths of the timing analysis that are not in the subset and pass through the primitive element, replacing the primitive element with a first and second primitive element, with the subset of the critical timing paths passing through the first primitive element and the additional paths passing through the second primitive element.

12. The processor-implemented method of claim 1, wherein:
 the placing includes the priority placing of the primitive element on the critical timing path at the respective position in response to the critical timing path not meeting the performance objective for the respective reason of bad placement; and
 the priority placing includes placing the primitive element at the respective position before placing the primitive elements that are not on the critical timing paths.

13. The processor-implemented method of claim 1, wherein:
 the routing includes routing the interconnections between the primitive elements at the respective positions without regard to overlap between the interconnections and subsequently rerouting the interconnections that have the overlap until the overlap is eliminated;
 the priority routing includes assigning a priority mark to each of the interconnections on each of the critical timing paths in response to the critical timing path not meeting the performance objective for the respective reason of long routing; and
 the rerouting the interconnections that have the overlap includes preferentially rerouting the interconnections that have the overlap and do not have the priority mark.

14. The processor-implemented method of claim 1, further comprising:
 performing a plurality of iterations of the generating of the timing analysis, the determining of the respective reasons for the critical timing paths, the synthesizing the specification of the design into the netlist, the placing of the primitive elements, and the routing of the interconnections between the primitive elements;
 wherein for each of the iterations, the generating the timing analysis for the iteration includes generating the timing analysis from a result of a preceding one of the iterations; and
 wherein the result is the placing and the routing of the synthesizing of the specification of the design from the preceding iteration.

15. The processor-implemented method of claim 14, wherein the determining of the respective reasons for the critical timing paths for each of the iterations includes accumulating the respective reasons for the iteration and the iterations preceding the iteration.

16. The processor-implemented method of claim 15, wherein the determining of the respective reason for each critical timing path for each of the iterations includes determining the respective reason for the critical timing path for each of the iterations that is exactly one of excessive fanout, bad placement, and long routing for each of the iterations.

17. The processor-implemented method of claim 1, wherein:
 the placing of the primitive elements at the respective positions includes coarsely placing the primitive elements within corresponding regions and the generating of the timing analysis includes generating the timing analysis of the coarsely placing of the synthesizing of the specification of the design; and for each primitive element on each critical timing path that does not meet the timing objective for the respective reason of bad placement, the priority placing includes assigning an initial placement for the primitive element in the corresponding region and keeping the initial placement as the respective position for the primitive element unless modifying the initial placement improves the critical timing path.

18. The processor-implemented method of claim 17, wherein the generating of the timing analysis for the design includes:
   synthesizing the specification of the design into a netlist specifying a plurality of interconnections of a plurality of primitive elements;
   placing the primitive elements at a plurality of initial respective positions;
   routing the interconnections between the primitive elements at the initial respective positions; and
   generating the timing analysis from the primitive elements placed at the initial respective positions and the interconnections routed between the primitive elements at the initial respective positions.

19. The processor-implemented method of claim 1, wherein:
   the routing of the interconnections between the primitive elements at the respective positions includes coarsely routing the interconnections through corresponding regions and the generating of the timing analysis includes generating the timing analysis of the placing and the coarsely routing of the synthesizing of the specification of the design; and
   for each interconnection on each critical timing path that does not meet the timing objective for the respective reason of long routing, the priority routing includes assigning an initial route for the interconnection through the corresponding region and keeping the initial route unless modifying the initial route improves the critical timing path.

20. A non-transitory program storage medium, comprising:
   a processor-readable storage device configured with instructions for implementing a design of an integrated circuit to meet a performance objective, wherein execution of the instructions by one or more processors causes the one or more processors to perform operations including:
   inputting a specification of the design in a hardware description language;
   generating a timing analysis for the design, the timing analysis specifying a plurality of critical timing paths that do not meet the performance objective;
   determining a plurality of respective reasons for the critical timing paths not meeting the performance objective, wherein the respective reason for each critical timing path is one of excessive fanout, bad placement, and long routing;
   synthesizing the specification of the design into a netlist specifying a plurality of interconnections of a plurality of primitive elements;
   wherein the synthesizing includes controlling a fanout of one of the primitive elements on each of the critical timing paths in response to the respective reason for the critical timing path not meeting the performance objective being excessive fanout;
   placing the primitive elements at a plurality of respective positions, wherein the placing includes priority placing of one of the primitive elements on each of the critical timing paths in response to the respective reason for the critical timing path not meeting the performance objective being bad placement;
   routing the interconnections between the primitive elements at the respective positions;
   wherein the routing includes priority routing of one of the interconnections on each of the critical timing paths in response to the respective reason for the critical timing path not meeting the performance objective being long routing; and
   storing a specification of the primitive elements placed by the placing step and the interconnections routed by the routing step.

* * * * *